(12) United States Patent
Iyer et al.

(10) Patent No.: US 9,208,878 B2
(45) Date of Patent: Dec. 8, 2015

(54) NON-VOLATILE MEMORY BASED ON RETENTION MODULATION

(71) Applicant: International Business Machines Corporation, Armonk, NY (US)

(72) Inventors: Subramanian S. Iyer, Mount Kisco, NY (US); Toshiaki Kirihata, Poughkeepsie, NY (US); Chandrasekharan Kothandaraman, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 71 days.

(21) Appl. No.: 14/224,425

(22) Filed: Mar. 25, 2014

(65) Prior Publication Data

US 2015/0279462 A1    Oct. 1, 2015

(51) Int. Cl.
*G11C 16/04*    (2006.01)
*G11C 14/00*    (2006.01)

(52) U.S. Cl.
CPC ........ *G11C 14/0018* (2013.01); *G11C 16/0466* (2013.01)

(58) Field of Classification Search
USPC ............................ 365/185.18, 185.24, 189.07
See application file for complete search history.

(56) References Cited

U.S. PATENT DOCUMENTS

| | | | |
|---|---|---|---|
| 5,065,362 A | 11/1991 | Herdt et al. | |
| 5,633,178 A | 5/1997 | Kalnitsky | |
| 6,388,494 B1 | 5/2002 | Kindt et al. | |
| 6,700,155 B1 | 3/2004 | King et al. | |
| 7,379,381 B1 * | 5/2008 | Roy et al. | 365/233.1 |
| 7,450,452 B2 | 11/2008 | Rosal et al. | |
| 7,566,601 B2 | 7/2009 | Bhattacharyya | |
| 8,081,499 B2 | 12/2011 | Takahashi et al. | |
| 2007/0138555 A1 | 6/2007 | Bhattacharyya | |
| 2010/0302888 A1 * | 12/2010 | Mori et al. | 365/201 |

FOREIGN PATENT DOCUMENTS

KR    10-0922108 B1    10/2009

* cited by examiner

*Primary Examiner* — Vu Le
(74) *Attorney, Agent, or Firm* — Scully, Scott, Murphy & Presser, P.C.; Steven J. Meyers, Esq.

(57) ABSTRACT

A mechanism that provides a source of reliability concern is leveraged to establish a non-volatile memory element. A memory cell may be programmed to have a longer retention time or a shorter retention time. Such mechanisms include, but are not limited to, threshold voltage modulation by charge trapping in the gate dielectric of an access transistor of a dynamic random access memory (DRAM) cell. A memory cell is programmed with a voltage pulse into a long retention time mode or into a short retention time mode. The programmed mode of each memory cell may be read by storing electrical charges in the DRAM cells, and by measuring whether the electrical charges remain after a threshold retention time. Further, a dual mode memory cell may be operated as a conventional DRAM cell, or as a non-volatile memory storing retention time as data.

20 Claims, 9 Drawing Sheets

NON-VOLATILE MEMORY BASED ON RETENTION MODULATION

BACKGROUND

The present disclosure relates to a semiconductor circuit, and particularly to a memory circuit employing non-volatile memory cells having programmable retention time and a method of operating the same.

Dense non-volatile embedded memory is a much-desired feature in modern integrated circuits. Non-volatile embedded memories are extensively used in all integrated circuit products to repair chips during manufacturing, at module assembly level, and during operation in a product in the field. In addition, non-volatile embedded memories are an important part of reconfiguring semiconductor chips, managing power, providing chip security, and so forth. The key requirements of such non-volatile memories include real or virtual non-volatility of the stored information, a reasonable level of endurance, a minimal process complexity adder, and a device density that is at least comparable to that of static random access memory (SRAM) devices.

Currently, a preferred non-volatile embedded memory is an electrically programmable fuse (eFuse) based on electromigration of a metal silicide. Unfortunately, usability of eFuses is diminishing in advanced semiconductor devices due to increased complexity of front end processes in gate-last fin field effect transistor (FINFET) technology. Further, scaling of eFuses is difficult due to the need to employ an element having an electromigratable metal silicide. In addition, an eFuse is a single-use programmable element, and as such, is commonly referred to as one-time programmable read only memory (OTPROM) device.

SUMMARY

A mechanism that provides a source of reliability concern is leveraged to establish a non-volatile memory element. Any mechanism that can alter the retention time of a capacitor can be employed to program a memory cell to have a longer retention time or a shorter retention time. Such mechanisms include, but are not limited to, threshold voltage modulation by charge trapping in the gate dielectric of an access transistor of a dynamic random access memory (DRAM) cell. A memory cell is programmed with a voltage pulse into a long retention time mode or into a short retention time mode. The programmed mode of each memory cell can be read by storing electrical charges in the DRAM cells, and by measuring whether the electrical charges remain after a threshold retention time. Further, a dual mode memory cell can be operated as a conventional DRAM cell, or as a non-volatile memory storing retention time as data.

According to an aspect of the present disclosure, a semiconductor circuit includes an array of memory cells and comparators. The array of memory cells is configured to be programmed into a selected memory mode selected from a short retention time mode and a long retention time mode in a programming operation. Each memory cell in the array is configured to store, after a charging operation on the array of memory cells, a quantity of electrical charges. Each memory cell in the short retention time mode retains electrical charges for a duration shorter than a threshold retention time and each memory cell in the long retention time mode retains electrical charges for a duration longer than the threshold retention time. The comparators are configured to compare output voltages from the array of memory cells with a sensing reference voltage and to generate an output based on a sign of a difference between an output voltage of a selected memory cell and the sensing reference voltage.

According to another aspect of the present disclosure, a semiconductor circuit includes a memory cell array. Memory cells in the memory cell array are configured to be operable in a first mode of a retention time mode in which stored data is in a form of a selected programmed mode having different durations of a charge retention time, and to be operable in a second mode of charge data mode in which stored data is in a form of an amount of electrical charge stored in a corresponding memory cell. The semiconductor circuit is configured so that selection between said first and second modes is made depending on a parameter that is internally generated or externally supplied.

According to yet another aspect of the present disclosure, a method of operating a semiconductor circuit includes providing an array of memory cells configured to store electrical charges therein. Each memory cell in the array can be programmed into a selected memory mode selected from a short retention time mode and a long retention time mode in a programming operation. The long retention time mode provides a retention time longer than a threshold retention time and the short retention time mode provides a retention time shorted than the threshold retention time. A same amount of electrical charge is stored irrespective of a corresponding selected memory mode within each memory cell in the array in a charging operation. A memory mode of each memory cell is subsequently determined by measuring a quantity of a remaining electrical charge in each corresponding memory cell in a sensing operation performed the threshold retention time after the charging operation.

According to still another aspect of the present disclosure, a semiconductor circuit includes an array of memory cells and comparators. The array of memory cells is configured to be programmed into a selected memory mode selected from a short retention time mode and a long retention time mode in a programming operation. Each memory cell in the array is configured to store, after a charging operation on the array of memory cells, a same amount of electrical charge irrespective of a corresponding selected memory mode. Each memory cell in the short retention time mode retains electrical charges for a duration shorter than a threshold retention time and each memory cell in the long retention time mode retains electrical charges for a duration longer than the threshold retention time. The comparators are configured to compare output voltages from the array of memory cells with a sensing reference voltage and to generate an output based on a sign of a difference between an output voltage of a selected memory cell and the sensing reference voltage.

According to even another aspect of the present disclosure, a semiconductor circuit includes a memory cell array and a partition controller. The memory cell array is configured to be partitioned into a first array of memory cells in which stored data is in a form of a selected programmed mode having different durations of a charge retention time, and a second array of memory cells in which stored data is in a form of an amount of electrical charge stored in a corresponding memory cell. The partition controller is configured to change sizes of the first and second arrays depending on a parameter that is internally generated or externally supplied.

DETAILED DESCRIPTION

As stated above, the present disclosure relates to a memory circuit employing non-volatile memory cells having programmable retention time and a method of operating the same. Aspects of the present disclosure are now described in detail with accompanying figures. It is noted that like reference numerals refer to like elements across different embodiments. The drawings are not necessarily drawn to scale.

Currently, the retention time in a dynamic random access memory (DRAM) cell is determined by the leakage current in the cell. The two components that affect the leakage current of a DRAM cell include the leakage current through the node dielectric of the capacitor of the DRAM cell and the threshold voltage of the access transistor of the DRAM cell. According to an embodiment of the present disclosure, modulation of the retention of the DRAM cell is an operational principle that enables a new functionality to a DRAM cell, which can be employed to create new application of DRAM cells.

At the time of manufacture of a DRAM cell, the retention time of the DRAM cell may be modulated by selecting the thickness and/or leakage characteristics of the node dielectric, and/or by selecting the transistor characteristics of the access transistor. According to an embodiment of the present disclosure, the retention time of a DRAM cell is changed after manufacture of the DRAM cell and during the operation of the DRAM cell as a component in an integrated semiconductor system, and the change in the retention time may be employed as data stored in the DRAM cell. In other words, a DRAM cell may have multiple states having different retention times, and the selected state for the retention time of the DRAM cell is the data stored within the DRAM cell. Different states of the retention time for the DRAM cell correspond to a different data bit that is stored within the DRAM cell.

Figure 1A:
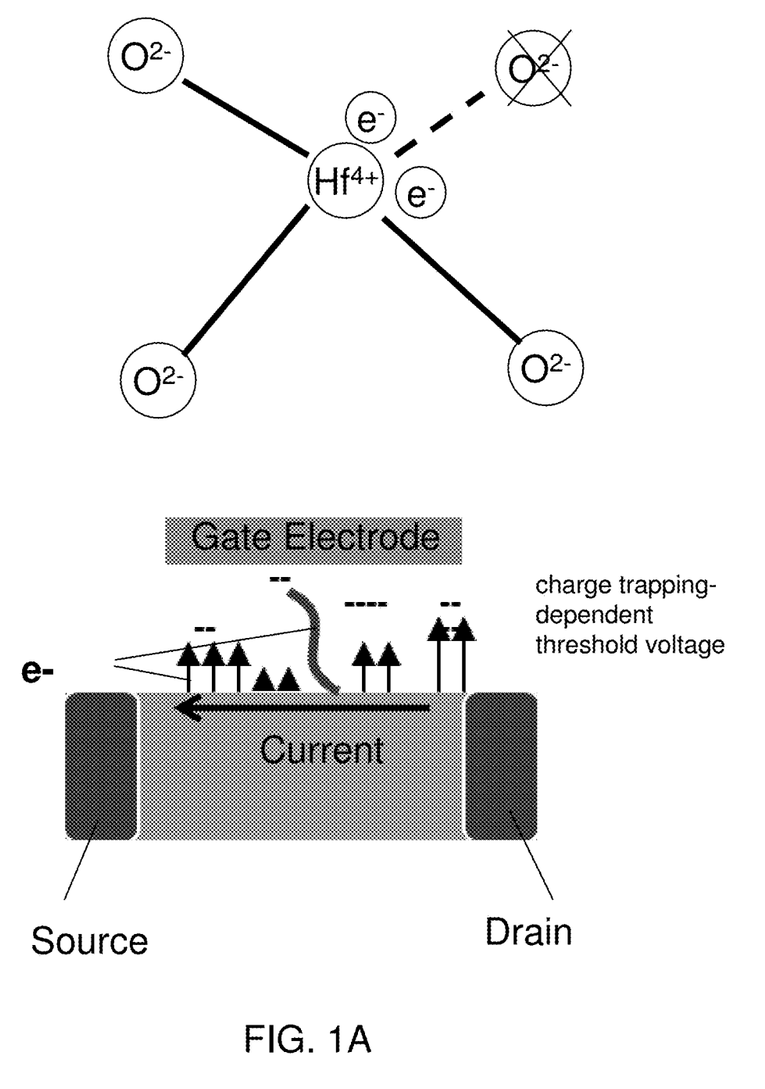
FIG. 1A illustrates a charge trap and de-trap behavior in an n-type metal-oxide-semiconductor field effect transistor.

In an illustrative example shown in FIG. 1A, a retention modulation memory may use a charge trap behavior to an n-type metal-oxide-semiconductor (NMOS) device (such as an n-type metal-oxide-semiconductor field effect transistor) to increase the threshold voltage VT such that the memory cell maintain the written data bit longer than other memory cell. This results in a longer retention time. The NMOS device has an initial threshold voltage of $VT_0$. In order to increase the threshold voltage VT, the NMOS device traps some electrons (e−) to the vacancy of oxygen ($O_2$) in the gate dielectric of the NMOS device. The gate dielectric (e.g., $Hf^{4+}$ oxide) may include a dielectric metal oxide such as hafnium oxide. The vacant oxygen point in dielectric metal oxide traps some electrons under the condition a high voltage applied across the gate dielectric while another high voltage is applied between the source region and the drain region of the NMOS device such that the NMOS device strongly turns on to flow a large current though the channel of the NMOS device. The trapped charges (e−) increase the threshold voltage of the NMOS device shifts to a shifted threshold voltage $VT_1$, which can be the sum of the initial threshold volage $VT_0$ and a threshold voltage shift $DV_T$, i.e., $VT_0 + DV_T$. The trapped electrons (e−) can be eliminated by applying a negative voltage between the gate electrode and source region, recovering the initial threshold voltage $DV_0$ for the NMOS device. A similar operational principle applies to PMOS device with the substitution of holes for electrons In general, any method of changing the retention time for a DRAM cell is compatible with the present disclosure. In one embodiment, the threshold voltage of the access transistor in a DRAM cell can be changed by trapping electrical charge carriers (i.e., electrons or holes) in the gate dielectric of the access transistor as shown in FIG. 1A. Charge trapping in the gate dielectric of a field effect transistor changes the threshold voltage of the access transistor, and hence, changes the retention time of the DRAM cell.

Figure 1B:
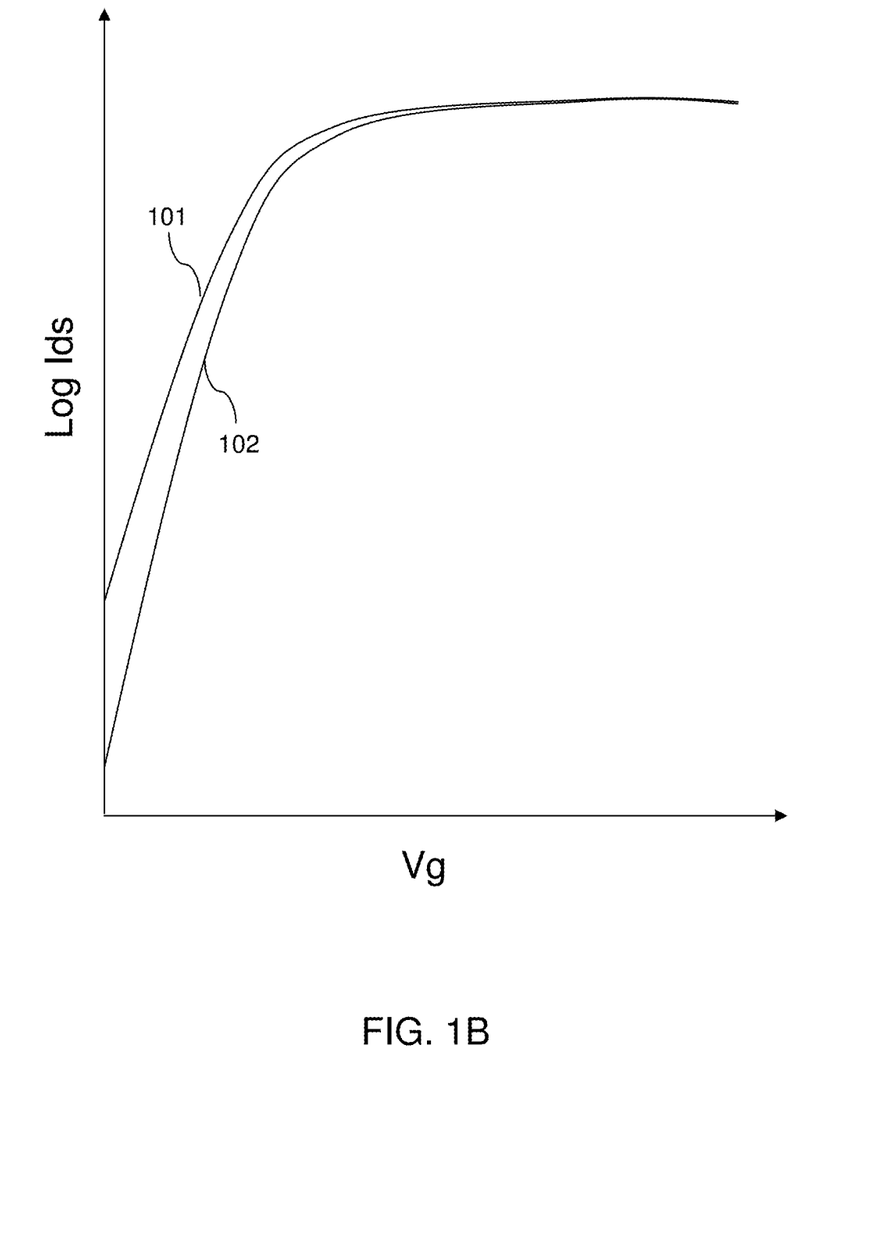
FIG. 1B is a graph of the logarithm of a drain-to-source current as a function of a gate-to-source voltage that illustrates the behavior of each of two retention time modes that a memory cell can display according to an embodiment of the present disclosure.

FIG. 1B illustrates two curves (101, 102) corresponding to two different states (un-trapped and trapped) of an NMOS access transistor, which are employed to implement the methods of the present disclosure. The horizontal axis labeled "Vg" represents the gate to source voltage, and the vertical axis labeled "Log Ids" represents the logarithm of the drain-to-source current. Each curve (101 or 102) represents a state of the access transistor, which remains the same unless the electrical charge trapped in the gate dielectric changes under a condition that injects more electrical charges into, or depletes the electrical charges from, the gate dielectric.

In addition, the changes in the threshold voltage of the access transistor is reversible by de-trapping the charge form the dielectrics. Thus, the state of a DRAM cell can reversibly change from a first state having a first retention time to a second state having a second retention time, and vice versa. Optionally, the two states may be created or recovered by trapping or de-trapping different amount of the charges.

The following discussion assumes the NMOS access transistor for DRAM cell, which traps the electrons to increase the threshold voltage, resulting in a longer retention time. The trapped electron may be eliminated by de-trapping the electrons, recovering the retention time (or short retention time) before the electron trapping. However, the invention may employ PMOS access transistor by trapping or de-trapping holes to moderate the retention time. For simplicity, the following discussion use the word of programming the data bits by trapping or de-trapping the electrons. Because of the charge trapping behavior, the number of the write is limited, and therefore this memory is suitable for multi-time read only memory (MTPROM). However, the concept of this invention may be used for any non-volatile memory which allows a random write and read operation as long as write endurance is allowed by technology.

Figure 2:
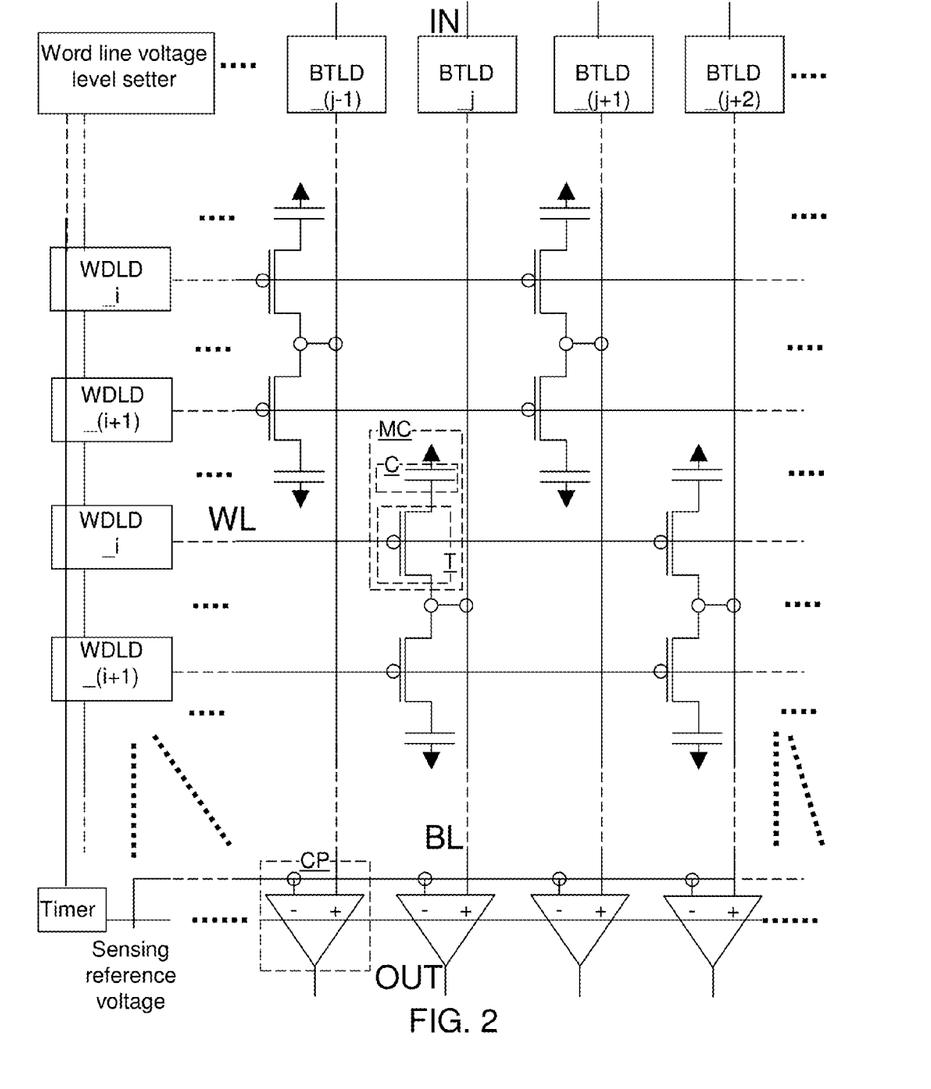
FIG. 2 is a schematic for a first exemplary semiconductor circuit in which each data bit is stored in a single memory cell according to an embodiment of the present disclosure.

According to an embodiment of the present disclosure, an array of memory cells is provided, which is configured to store electrical charges therein. Referring to FIG. 2, a first exemplary semiconductor circuit according to an embodiment of the present disclosure includes an array of memory cells and peripheral circuits that enable storage of information in the form of a selected retention time mode in each memory cell. In the first exemplary semiconductor circuit, each data bit is stored in a single memory cell. In the present disclosure, the term "array of memory cells" and "memory cell array" are employed interchangeably.

Specifically, the array of memory cells (MC) can employ a conventional array of DRAM cells in a 1T1C configuration, i.e., a configuration in which each memory cell includes a single access transistor (T) and a single capacitor (C). Word lines (WLs) connected to the gates of the access transistors and bit lines (BLs) connected to the drains of the access transistors are employed to control the operation of the array of memory cells. A combination of a bit line and a word line and their voltage control are employed to induce charge trapping or charge de-trapping in the gate dielectric of a target access transistor, and the resulting shift of the threshold voltage change only for the target cells. This mode of operation of the array of memory cells provides a Multiple-Time-Programmable-Read-Only-Memory (MTPROM) device.

The first exemplary semiconductor circuit includes an array of memory cells MC. Each of the memory cells MC in the array is configured to be programmed into a selected memory mode, which can be selected from a short retention time mode and a long retention time mode. As used herein, a "short retention time mode" is a mode of operation of a memory cell having a variable retention time in which a selected value of the variable retention time is less than a fixed predefined reference value for the variable retention time. As used herein, a "long retention time mode" is a mode of operation of a memory cell having a variable retention time in which a selected value of the retention time is greater than a fixed predefined reference value for the variable retention time. The fixed predefined reference value for the variable retention time is herein referred to as a threshold retention time. The programming of the array of memory cells MC can be performed in a programming operation, which encodes each memory cell MC with a corresponding selected memory mode by providing each memory cell MC a set of programming conditions that results in the selected memory mode. More specifically, memory cells having shorter retention mode are the cells without trapping the charge, and memory cells having longer retention mode are the cells with trapping the charge. The memory cells with longer retention mode may be changed to the memory cells with shorter retention mode by de-trapping the charge. Each set of programming conditions may trap, or de-trap, electrical charges in the gate dielectric of a corresponding NMOS access transistor as discussed in FIG. 1.

In one embodiment, each memory cell MC in the array can be configured to store, after a charging operation on the array of memory cells, the same amount of electrical charge irrespective of a corresponding selected memory mode. The charging operation is performed after the programming operation (or before read operation). Each memory cell MC in the short retention time mode retains electrical charges for a duration shorter than a threshold retention time and each memory cell MC in the long retention time mode retains electrical charges for a duration longer than the threshold retention time. Each memory cell MC in the array is arbitrarily programmable, i.e., is programmable into an arbitrary state selected from the short retention time mode and the long retention time mode irrespective of how any other memory cell MC is programmed.

The first exemplary semiconductor circuit includes a programming circuitry configured to supply different programming voltages to each memory cell MC depending on a corresponding selected memory mode. The different programming voltages can program each programmed memory cell into states having different levels of leakage currents.

In one embodiment, each memory cell MC within the array includes a dynamic random access memory (DRAM) cell that contains a series connection of a capacitor and an NMOS access transistor. In this case, programming of each memory cell MC can be performed by selecting a leakage current level of a corresponding NMOS access transistor through charge trapping in a gate dielectric. Drain nodes of NMOS access transistors within the same column can be electrically shorted to a bit line (BL), and gate nodes of NMOS access transistors within the same row can be electrically shorted to a word line (WL).

The peripheral circuitry includes a set of word line drivers and a set of bit line write drivers. Each physical word line can be driven by, i.e., supplied with a suitable voltage level necessary for operation, a word line driver (WDLD). Each physical bit line can be driven by a bit line write driver (BTLD). For example, the array of memory cells MC can be an M×N array including M logical word lines, N logical bit lines, and memory cells MC of which the total number is equal to the product of M and N.

The M logical word lines can be implemented by M physical word lines or mM physical word lines, in which m is an integer greater than 1. For each value of an integer index i running from 1 to M, one instance of an i-th word line driver WDLD_i is connected to each physical word line corresponding to an i-th logical word line and connected to the gates of access field effect transistors within the i-th logical row within the M×N array.

The N logical bit lines can be implemented by N physical bit lines or nN physical bit lines, in which n is an integer greater than 1. For each value of an integer index j running from 1 to N, one instance of a j-th bit line write driver BTLD_j is connected to each physical bit line corresponding to a j-th logical bit line and connected to the drains of access field effect transistors within the j-th logical column within the M×N array.

Each memory cell MC within the array of memory cells can be uniquely addressed by activating a word line among the set of all word lines and a bit line among the set of all bit lines. The ability to uniquely address any memory cell MC within the array enables independent programming of each memory cell MC, i.e., without being affected by which retention time state any other memory cell in the array is programmed into.

Each bit line is configured to supply a voltage selected from a plurality of write voltages during programming of each memory cells. In one embodiment, the plurality of write voltages can be two distinct voltages to be selected from for application to a corresponding drain. For example, the selected voltage can be a drain voltage needed to program a target memory cell MC into the short retention time mode, or can be a drain voltage needed to program the target memory cell MC into the long retention time mode.

Each word line is configured to supply a voltage selected from a plurality of gate voltages during programming of each memory cells. In one embodiment, the plurality of write voltages can be two distinct voltages to be selected from for application to a corresponding gate. The selected voltage can be a gate voltage needed to program a target memory cell MC into the short retention time mode, or can be a gate voltage needed to program the target memory cell MC into the long retention time mode.

In one embodiment, the gate voltages needed to program memory cells MC can be different from gate voltages needed to charge the capacitors during a charging operation, or gate voltages needed to sense the contents of data bits stored in the memory cells MC in a sensing operation. In this case, the peripheral circuitry can include a word line voltage shifter configured to change the gate voltage applied to the gate of each memory cell MC between the programming operation and the charging operation.

During the programming operation, each memory cell in the array is programmed into a selected memory mode, which is selected from a short retention time mode and a long retention time mode in a programming operation, where shorter and longer retention modes are created by de-trapping and trapping the charges to the dielectrics of the NMOS access transistor, respectively. The long retention time mode provides a retention time longer than a threshold retention time, and the short retention time mode provides a retention time shorted than the threshold retention time. In one embodiment, an array of data bits to be stored within the array of memory cells can be provided. Subsequently, each memory cell in the array can be programmed to store the array of data bits such that each selected memory mode in the array of memory cells corresponds to a value of a corresponding data bit within the array of data bits. Thus, each stored state of the retention time mode is the stored data bit within the array of memory cells MC. Different programming voltages can be supplied to each memory cell MC in the array depending on the corresponding selected memory mode.

Figure 3:
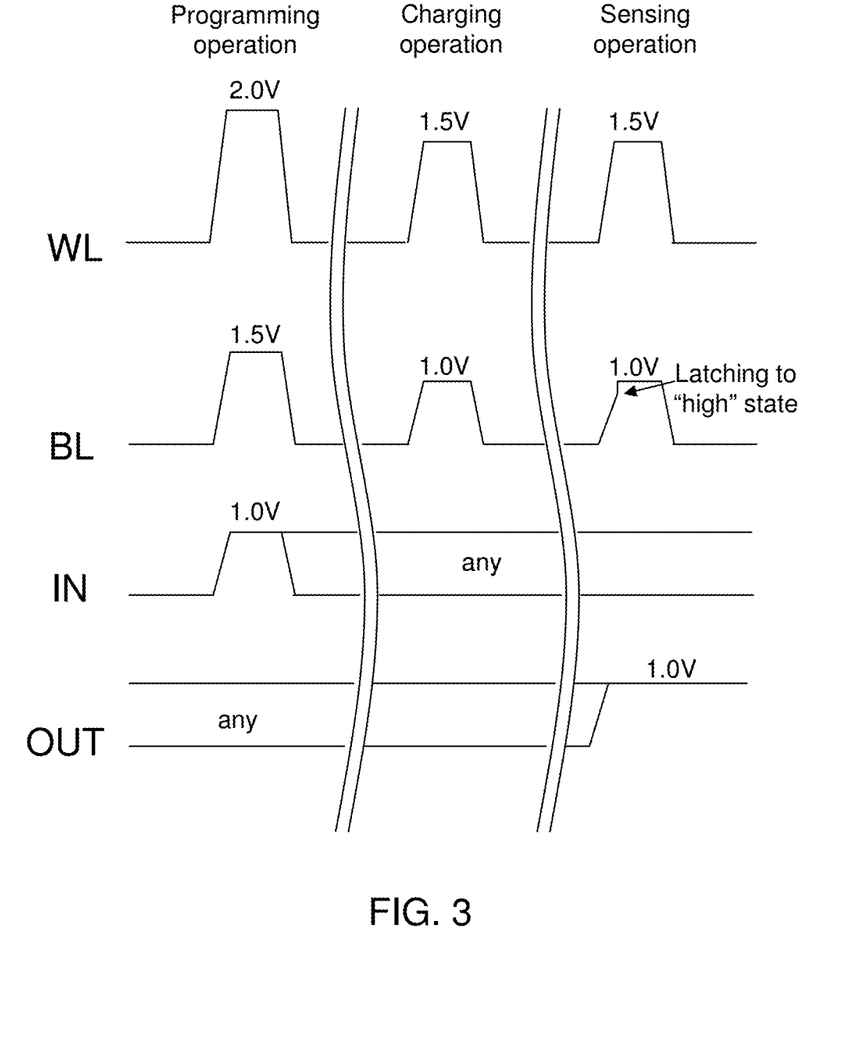
FIG. 3 is a timing diagram illustrating voltages at various nodes of a memory cell in the first exemplary semiconductor circuit at various operational phases when the memory cell is programmed, charged, and sensed for storing a data bit corresponding to a long retention time mode according to an embodiment of the present disclosure.

Referring to FIG. 3, a timing diagram illustrates voltages at various nodes when a data bit corresponding to a long retention time mode is stored in the memory cell MC connected to the i-th logical word line and to the j-th logical bit line. The case of an n-type field effect transistor for each access field effect transistor is illustrated.

For an illustrative purpose, a stand-by state of wordlines and bitlines coupling to memory cells are 0V. Prior to programming, the capacitor of the target memory cell for programming should be written to 0 voltage—Step 1. This can be done by activating the wordline (WL) at 1.5V, while forcing the bitline (BL) at 0V. During long retention mode programming of the target memory cell connected to the i-th logical word line and to the j-th logical bit line, a higher-than-normal gate voltage (e.g., 2.0V) and a higher-than-normal drain voltage (e.g., 1.5 V) can be applied to the access transistor connected to the i-th logical word line and to the j-th logical bit line. This results in a large current flow from the capacitor strong 0V of the target cell to the corresponding bitline at 1.5V—Step 2. The higher-than-normal gate voltage can be generated by the word line voltage level shifter. Further, the higher-than-normal drain voltage can be generated by a bit line voltage level shifter (not illustrated). The larger current flow due to the higher voltages at the gate and drain of the access transistor causes increased charge carrier scattering at the drain and electrical charges are injected into the gate of the access transistor, thereby causing charge trapping within the gate dielectric of the access transistor connected to the i-th logical word line and to the j-th logical bit line, and permanently shifting the threshold voltage of the access transistor to a level corresponding to presence of trapped charges (such as curve 102 in FIG. 1). To increase the amount of the charge trapping, the procedures—Step 1 and 2 can be repeated. In this particular case, extra electrons trapped within the gate dielectric of an NMOS transistor can increase the threshold voltage of the access transistor connected to the i-th logical word line and to the j-th logical bit line, and place the corresponding memory cell in the long retention time mode. Thus, the memory cell connected to the i-th logical word line and to the j-th logical bit line is programmed into the long retention time mode. During the programming the target memory cell to long retention mode using higher wordline and bitline voltages, other wordlines and bitlines are kept at 0V, resulting in 0 current flow. Therefore, NMOS access transistors for non-target memory cells keep the original threshold voltage, resulting in a short retention mode if the NMOS have not yet been programmed for longer retention time mode. The NMOS access transistors may maintain the previous threshold voltage if the NMOS have been already programmed for long retention time mode.

Figure 4:
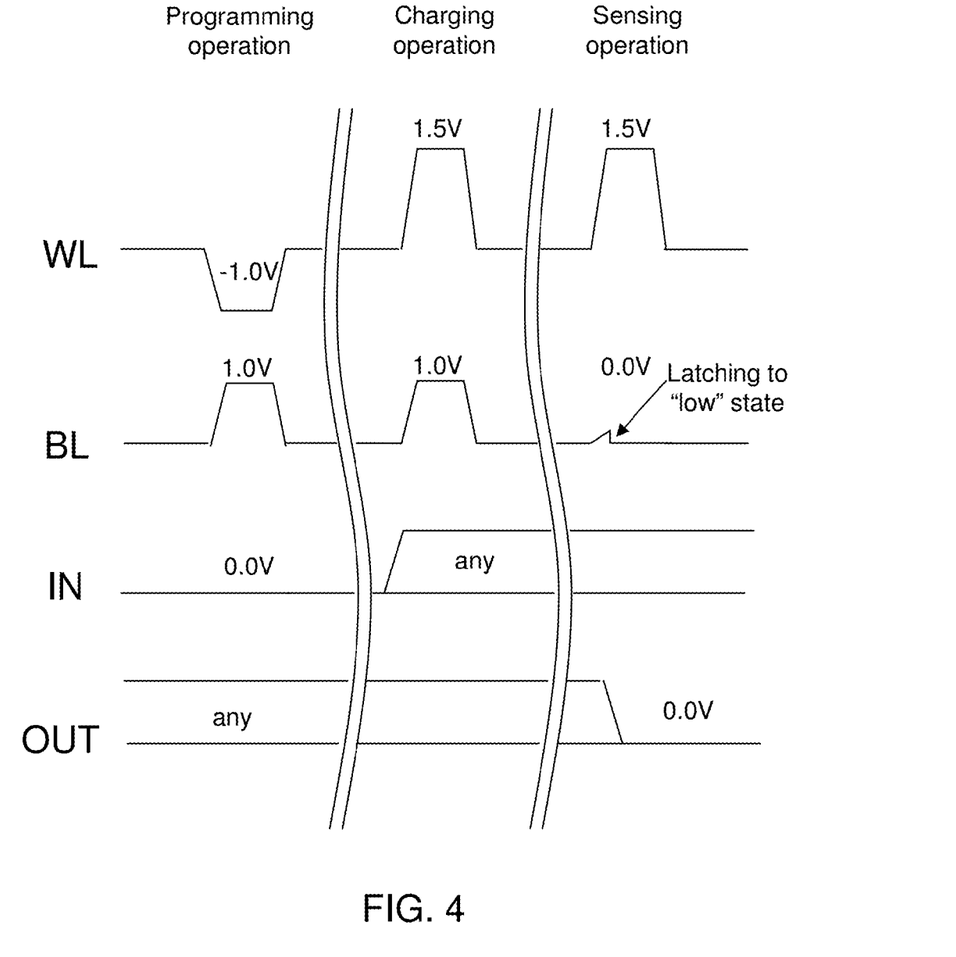
FIG. 4 is a timing diagram illustrating voltages at various nodes of a memory cell in the first exemplary semiconductor circuit at various operational phases when the memory cell is programmed, charged, and sensed for storing a data bit corresponding to a short retention time mode according to an embodiment of the present disclosure.

Referring to FIG. 4, a timing diagram illustrates voltages at various nodes when a data bit corresponding to a short retention time mode is stored in the memory cell MC connected to the i-th logical word line and to the j-th logical bit line For short retention mode programming of the memory cell, the i-th logical word line and to the j-th logical bit line coupling to the target memory cell are discharged and precharged to −1V and 1V bitline, respectively. This results in applying gate to source voltage (VGS) of −2V to the target memory cell. The negative gate voltage can be generated by the word line voltage level shifter. The VGS of −2V expels trapped charge carriers from the gate dielectric of the access transistor, thereby causing de-trapping of electrical charges from the gate dielectric of the access transistor connected to the i-th logical word line and to the j-th logical bit line, and permanently shifting the threshold voltage of the access transistor to a level corresponding to no trapped charges (such as curve 101 in FIG. 1). In this particular case, the absence of trapped electrical charges within the gate dielectric of an NMOS transistor can reset, i.e., decrease, the threshold voltage of the access transistor connected to the i-th logical word line and to the j-th logical bit line, and place the corresponding memory cell in the long retention time mode. Thus, the memory cell connected to the i-th logical word line and to the j-th logical bit line is programmed into the short retention time mode. During the programming the target memory cell to short retention mode using −1V wordline and 1V bitline voltages, other wordlines and bitlines are kept at 0V. Therefore, NMOS access transistors for non-target memory cells keep the threshold voltage previously programmed (either long retention mode or short retention mode).

Selection of the threshold retention time that functions as the threshold between the short retention time mode and the long retention time mode can be a matter of design choice. The threshold retention time may be, for example, in a range from 1 microsecond to 1 second, although lesser and greater threshold retention times can also be employed. In an illustrate example, the threshold retention time can be on the order of 40 microseconds.

Referring back to FIG. 2, each memory cell MC in the array of memory cells can be programmed into a selected mode, which can be the long retention time mode or the short retention time mode. The programming of the memory cells MC in the array can be performed in any order or sequence. For example, the programming of the memory cells MC can be performed row by row, or column by column. If a row by row programming mode is employed, different columns may be selected during programming of each selected row. If a column by column programming mode is employed, different rows can be selected during programming of each column. Optionally, some cells may not be programmed for future use. Optionally, only selected memory may be programmed by any sequence of row and column as long as the programmed addresses are managed by the system.

Once programming of each memory cell MC is completed, a data bit can be read after a charging operation has been performed. During the charging operation, each capacitor within the array of memory cells must be charged prior to the read operation. More specifically, during the charging operation, the gates of the access transistors are raised to 1.5V (i.e., set to a state that turns on the access transistors) through the 1.5V word lines, and the drains of the access transistors are raised at 1V through the bit lines. The 1.5V wordline and 1V bitline voltages are substantially lower voltage than programming (WL=2V and BL=1.5V for programming long retention mode or WL=−1V and BL=1V mode for programming short retention mode) in order not to trap the charge into the dielectric of the access transistor during the charge operation. Because the access transistor is on, electrical charges (or current) flow through the bit lines, through the drains and channels of the activated access transistors, and into the capacitors connected to the activated access transistors. The capacitors can maintain the electrical charge after the wordline goes 0V, however due to the leakage, the charge is degraded as time goes-by. Because the retention time depends on the programmed states (long retention mode or short retention mode), the states can be detected by simple read operation after the predetermined pause time.

In one embodiment, the operating point of the access transistors can be selected such that the on-current of the access transistor during the charging operation can be the same irrespective of the mode into which each memory cell MC is programmed. In one embodiment, the same gate voltage can be applied to each gate node in the array, and the same drain voltage can be applied to each drain node in the array during the charging operation.

In one embodiment, each capacitor in the array of memory cells can have the same capacitance (within the error of the specification for the capacitance). The same gate voltages and the same drain voltages are preferably employed for each access transistor during the charging operation such that each capacitor is charged with the same amount of electrical charge after the charging operation.

All capacitors in the array of memory cells can be charged with the same amount of electrical charge. The charging of the capacitors in the array of memory cells must be performed prior to the read operation to determine if then cell is programmed for short retention mode or long retention mode. For example, the charging of the memory cells MC can be performed row by row, or column by column. If a row by row programming mode is employed, all capacitors, or a subset of capacitors, within the memory cells in each selected row may be charged at a time. If a column by column programming mode is employed, all capacitors, or a subset of capacitors, within the memory cells in each selected column may be charged at a time. The same amount of electrical charge may be stored irrespective of the corresponding selected memory mode within each memory cell MC in the array during the charging operation. Optionally, the charging of the cell may be enabled before the read operation of the specific cell. This results in accessing any cell and any order, while avoiding redundant operation unnecessary for the read operation.

Referring to FIGS. 3 and 4, the timing diagrams illustrates voltages at various nodes when electrical charges are stored in the memory cell MC connected to the i-th logical word line and to the j-th logical bit line. Irrespective of the mode into which a memory cell is programmed, the gate and the drain of each access transistor can be activated to turn on the access transistor and to charge the capacitor connected to the access transistor with the same amount electrical charge.

Referring back to FIG. 2, the peripheral circuitry can further include comparators CP configured to compare output voltages from the array of memory cells MC with a sensing reference voltage. Employing the comparators, a sensing operation is performed the predetermined threshold retention time after performing the charging operation. The first exemplary semiconductor circuitry can be configured to perform the sensing operation upon passage of the threshold retention time after performing the charging operation. In one embodiment, the timer can be configured to trigger measurement of remaining electrical charge in the array of memory cells after passage of a time duration having the length of the threshold retention time from the charging operation.

The comparators are operated during a sensing operation, in which the programmed state of each memory cell MC is detected. Specifically, the predetermined threshold retention time can be adjusted to detect the low retention time cell as 0, and high retention time cell as 1 by using comparator using a reference voltage. During the sensing operation, the stored memory mode of each memory cell MC is detected by measuring the quantity of a remaining electrical charge in the corresponding capacitor. The bit line write drivers (BTLD) are electrically isolated from the bit lines by setting the output of the bit line write drivers BTLDs to a high output impedance state. Thus, the voltage at a corresponding bit line, and at the input node of a corresponding comparator, is determined by the quantity of the remaining electrical charge in the corresponding capacitor. If the amount of remaining electrical charge in the capacitor is sufficient charge to generate a voltage at a corresponding bit line that is higher than a sensing reference voltage, the memory cell including the capacitor is identified as a memory cell encoding the long retention time mode as a data bit. If the remaining electrical charge in the capacitor generates a voltage at a corresponding bit line that is lower than the sensing reference voltage, the memory cell including the capacitor is identified as a memory cell encoding the short retention time mode as a data bit.

The comparators can be configured to generate an output based on the sign of the difference between the output voltage of a selected memory cell MC and the sensing reference voltage. In one embodiment, the comparators can be operational amplifiers configured to generate a digital output depending on the sign of the difference between the output voltage of a selected memory cell MC and the sensing reference voltage. In other words, the comparators provide one type of output (e.g., a "high" output such as an output voltage of 1.0 V) if the output voltage of the selected memory cell MC is higher than the sensing reference voltage, and provide another type of output (e.g., a "low" output such as an output voltage of 0 V) if the output voltage of the selected memory cell MC is lower than the sensing reference voltage.

Referring to FIGS. 3 and 4, the access transistor of a memory cell MC selected for sensing the stored data therein is turned on by activating the corresponding word line (e.g., by supplying a voltage of 1.5 V as illustrated). When a word line is activated, all activated access transistors connected to the activated word line are turned on, and electrical charges stored in the capacitors connected to the activated access transistors flow through the channels of the access transistors and raise the voltage at the bit lines. The voltage at the bit lines are the input voltages for the comparators, which determine if the voltage at each bit line is higher or lower than the sensing reference voltage.

Optionally, a latching circuitry can be provided at the comparators such that an intermediate voltage between the maximum voltage (e.g., 1.0 V corresponding to a "high" state) and the sensing reference voltage at a bit line is latched to the maximum voltage, and an intermediate voltage between the minimum voltage (e.g., 0 V corresponding to a "low" state) and the sensing reference voltage at a bit line is latched to the minimum voltage. Buffer circuitry (not shown) can be employed to latch the output of the comparators until the next world line is activated and sensed.

Figure 5:
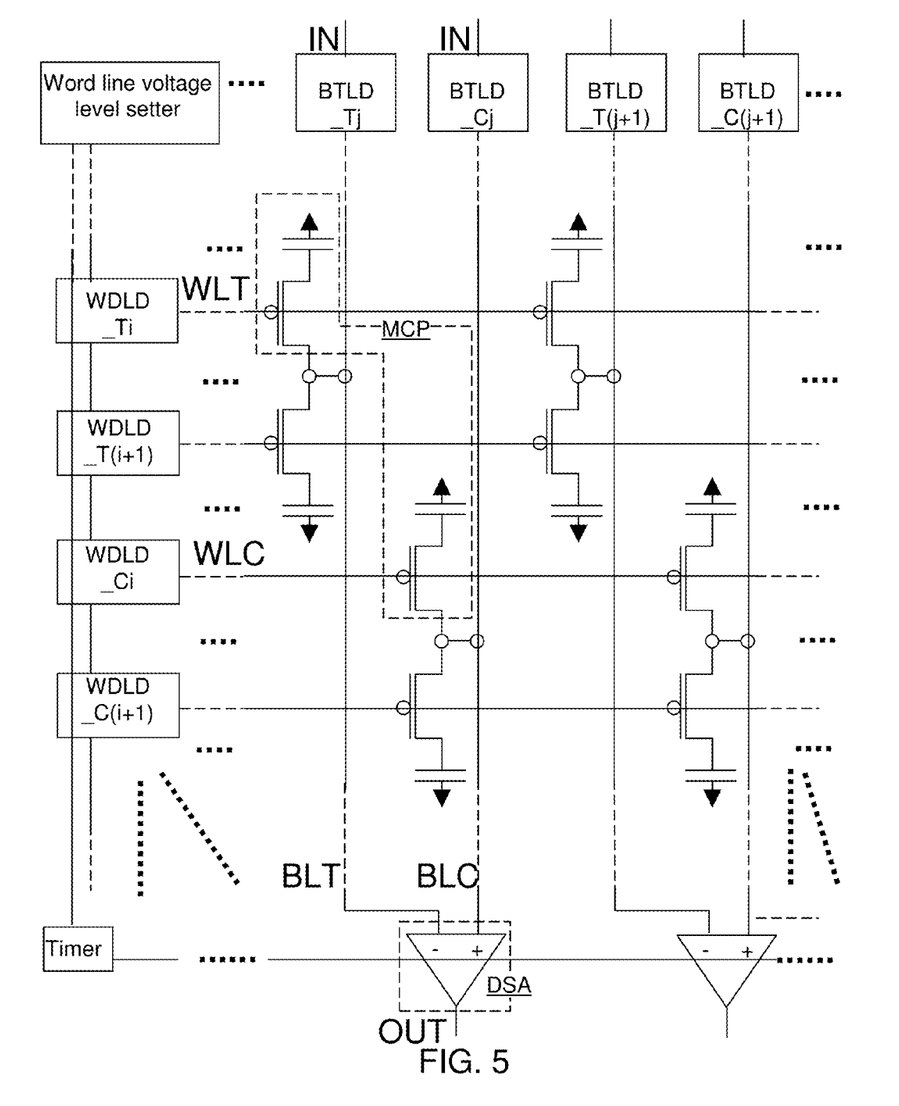
FIG. 5 is a schematic for a second exemplary semiconductor circuit in which each data bit is stored in a pair of memory cells according to an embodiment of the present disclosure.

Referring to FIG. 5, a second exemplary semiconductor circuitry according to an embodiment of the present disclosure can be derived from the first exemplary semiconductor circuitry illustrated in FIG. 2 by employing a pair of memory cells MCP to store one bit of data. Each data bit is stored in a pair of memory cells. The pair of memory cells can include a primary memory cell that stores a memory state corresponding to the data bit, and a complementary memory cell that stores a memory state corresponding to the complement of the data bit. For example, if the data bit to be stored is "1," the primary memory cell can store a long retention time mode as data, and the complementary memory cell can store a short retention time mode as data. If the data bit to be stored is "0," the primary memory cell can store a short retention time mode as data, and the complementary memory cell can store a long retention time mode as data. Unlike the previous embodiment shown in FIG. 2, differential sense amplifiers DSA, each coupling to true and complement bitlines (BLT and BLC) are used.

Corresponding to the pair of memory cells assigned to each data bit to be stored, the peripheral circuitry can have true word line drivers and complementary word line drivers in lieu of word line drivers illustrated in FIG. 2, and can have true bit line drivers and complementary bit line drivers in lieu of bit line drivers illustrated in FIG. 2.

Figure 6:
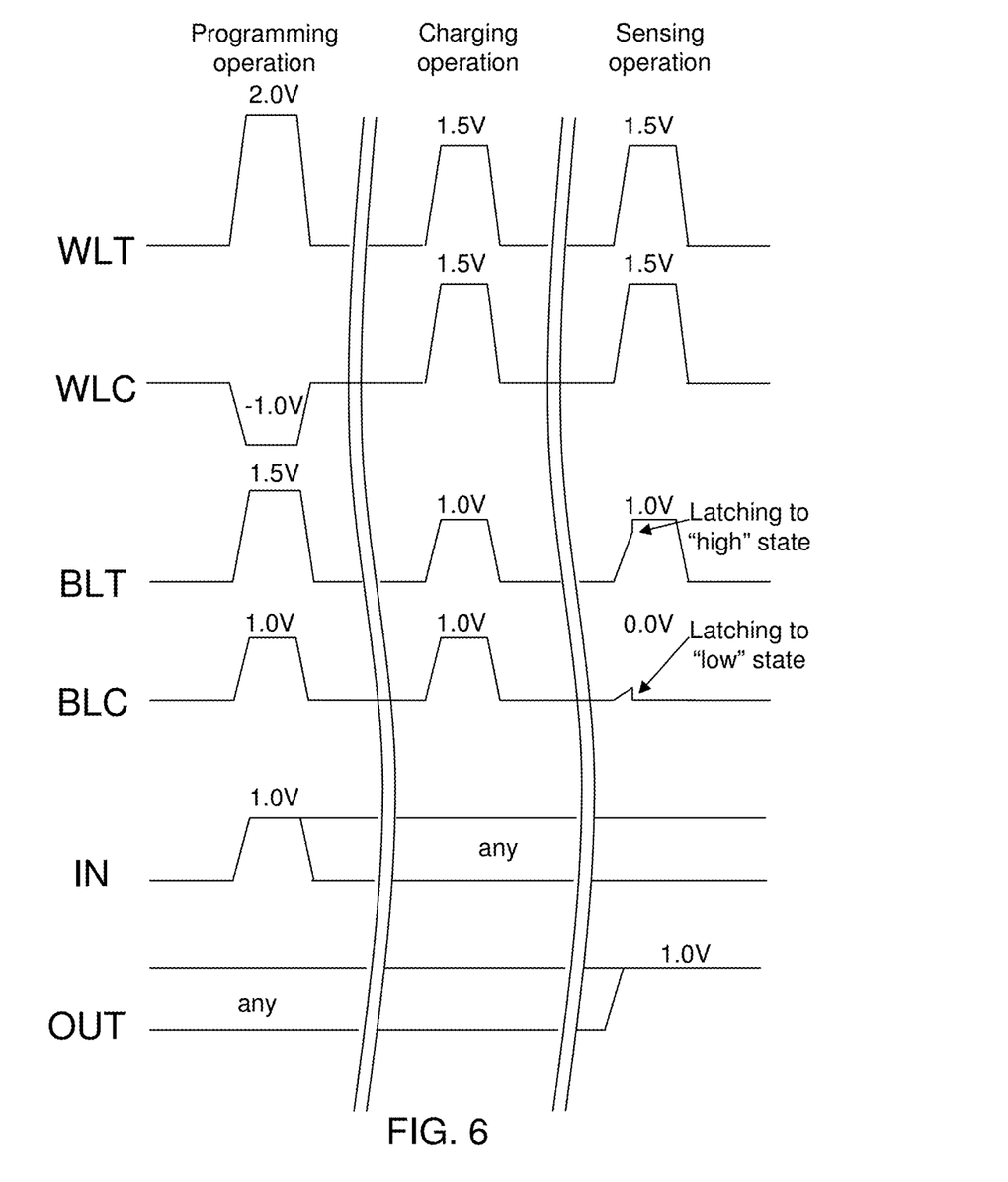
FIG. 6 is a timing diagram illustrating voltages at various nodes of a pair of memory cells in the second exemplary semiconductor circuit at various operational phases when the pair of memory cells is programmed, charged, and sensed for storing a data bit of 1 by enabling a long retention time mode for the cell of the pair coupling to true bitline and a short retention mode for the cell of the pair coupling to true bitline according to an embodiment of the present disclosure.
Figure 7:
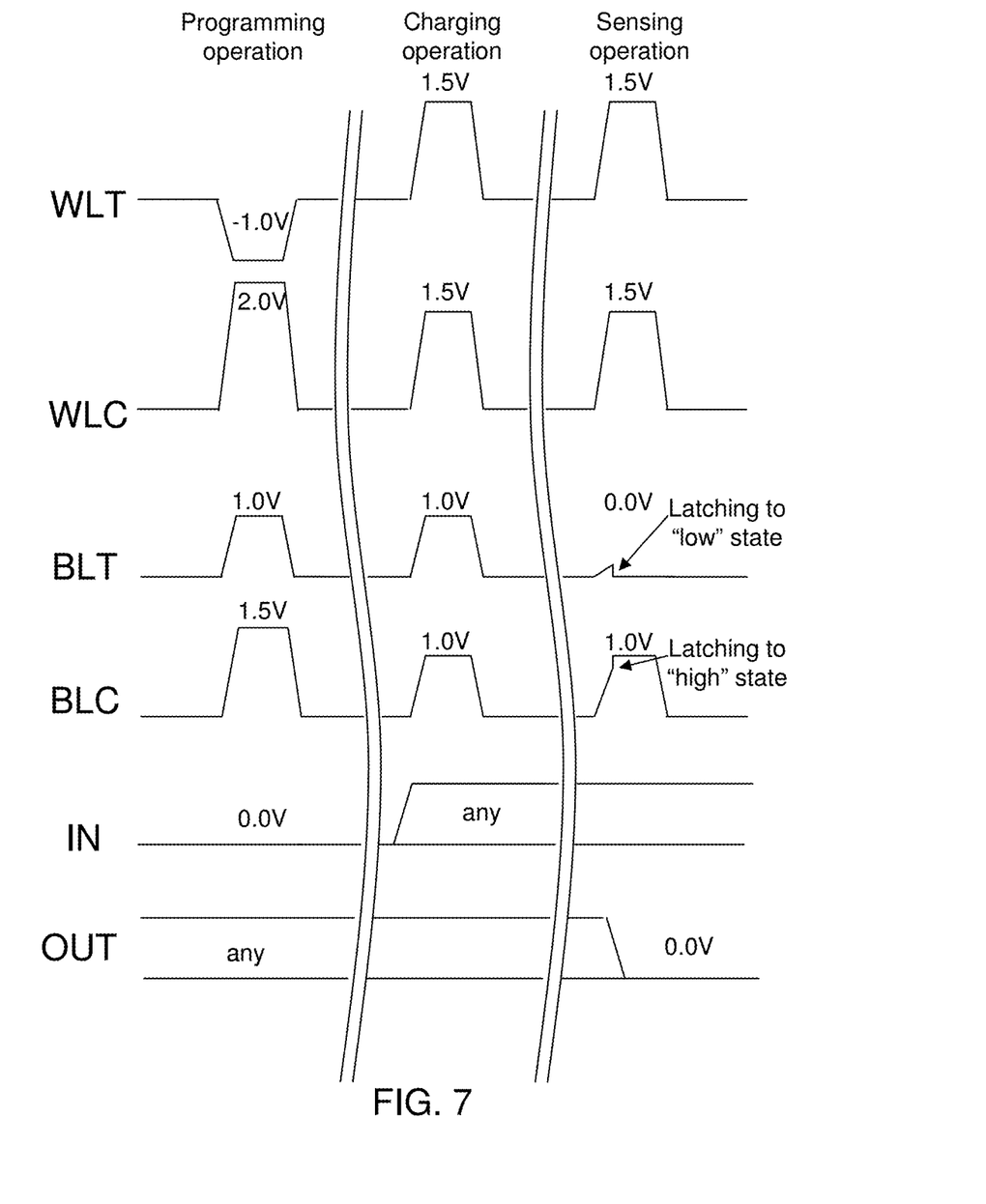
FIG. 7 is a timing diagram illustrating voltages at various nodes of a pair of memory cells in the second exemplary semiconductor circuit at various operational phases when the pair of memory cells is programmed, charged, and sensed for storing a data bit of 0 by enabling a short retention time mode for the cell of the pair coupling to true bitline and a long retention mode for the cell of the pair coupling to true bitline according to an embodiment of the present disclosure.

Timing diagrams in FIGS. 6 and 7 illustrate voltages at various nodes of a pair of memory cells connected to the i-th true word line, the i-th complementary word line, the j-th true bit line (BLT), and the j-th complementary bit line (BLC) in the second exemplary semiconductor circuit at various operational phases. Specifically, the timing diagram in FIGS. 6 and 7 corresponds to the case in which the pair of memory cells is programmed, charged, and sensed for 1 and 0, respectively.

Referring to FIG. 6, in order to program "1" in a complementary pair of memory cells in the i-th row and j-th column, the i-th true word line driver WDLD_Ti is driven high (e.g., to 2.0V) and the i-th complementary word line driver WDLD_Ci is driven low (e.g., to −1.0 V), and the j-th true bit line driver BTLD_Tj is driven high (e.g., to 1.5 V), and the j-th complementary bit line driver BTLD_Cj are driven low (e.g., to 0.0 V). The memory cell connected to the i-th true word line driver WDLD_Ti and the j-th true bit line driver BTLD_Tj is programmed into a long retention time mode, and the memory cell connected to the i-th complementary word line driver WDLD_Ti and the j-th complementary bit line driver BTLD_Tj is programmed into a short retention time mode.

Referring to FIG. 7, in order to program "0" in a complementary pair of memory cells in the i-th row and j-th column, the i-th true word line driver WDLD_Ti is driven low (e.g., to −1.0V) and the i-th complementary word line driver WDLD_Ci is driven high (e.g., to 2.0 V), and the j-th true bit line driver BTLD_Tj is driven low (e.g., to 0.0 V), and the j-th complementary bit line driver BTLD_Cj are driven high (e.g., to 1.5 V). The memory cell connected to the i-th true word line driver WDLD_Ti and the j-th true bit line driver BTLD_Tj is programmed into a short retention time mode, and the memory cell connected to the i-th complementary word line driver WDLD_Ti and the j-th complementary bit line driver BTLD_Tj is programmed into a long retention time mode.

The array of memory cells can be charged with electrical charges during the sensing operation. Referring back to FIGS. 6 and 7, a sensing operation can be performed at a predetermined pause time after the sensing operation. The predetermined pause time is the time duration of the time to develop a sufficient differential voltage between short retention cell and long retention cell. In other words, because of the retention time difference, the long retention cell keeps higher voltage than that for short retention cell resulting in creating a differential voltage as long as proper predetermined pause time is used. This thus creates a differential voltage on the true bitline (BLC) and complement bitline (BLC), when the wordline is activated. The differential voltage can be successfully sensed by using differential sense amplifier coupling true and complement bitlines (BLT and BLC). This sensing method can be applied to all complementary pair of memory cells in the array shown in FIG. 5. This approach does not need a reference voltage used for the first embodiment, and use the retention time difference between two adjacent NMOS, resulting in simpler control.

Figure 8:
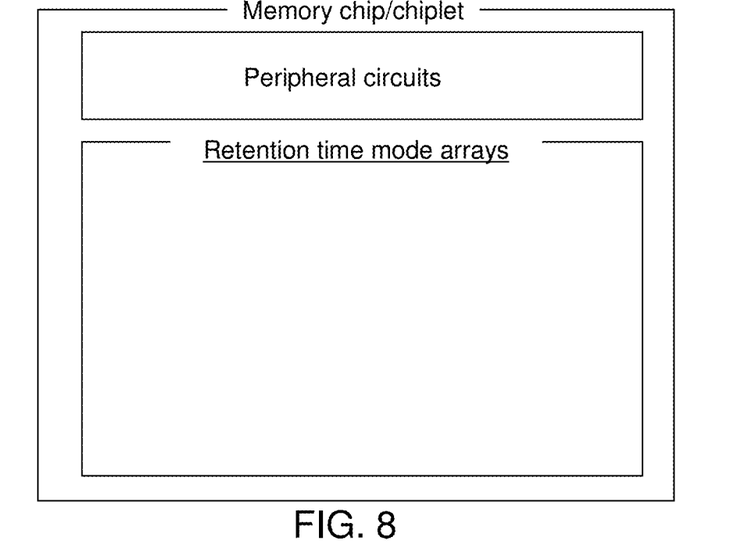
FIG. 8 is an exemplary semiconductor device embodying a semiconductor circuit including an array of memory cells configured to store data employing programmable retention times according to an embodiment of the present disclosure.

Referring to FIG. 8, an exemplary semiconductor device embodying a semiconductor circuit of the present disclosure is illustrated. The exemplary semiconductor device can be a stand-alone memory chip, or can be a chiplet embedded within a semiconductor chip that includes at least another chiplet (not shown). The semiconductor circuit incorporated into the exemplary semiconductor device can be any of the semiconductor circuits of the present disclosure as described above. In general, the semiconductor circuit includes an array of memory cells configured to store data employing programmable retention times. The array of memory cells can be operated in a manner that stores a retention time mode, i.e., a retention mode selected from a long retention time mode and a short retention time mode. As used herein, an array of memory cells that is operated in a manner that stores a retention time mode as a data bit is herein referred to as a "retention time mode array."

In one embodiment, all, or a portion, of any of the array of memory cells of the present disclosure can be employed as a normal dynamic random access memory (DRAM) circuit. In this case, the programming operation is omitted, and the charging operation is replaced with normal write operation for a DRAM circuit. In this case, all of the activated gates have a same voltage, i.e., a voltage that turns on the corresponding access transistor. The content of the data bit to be written into a corresponding capacitor is provided by the bit lines, which can have a "high" value if electrical charges are to be stored in a corresponding capacitor (that corresponds to writing a data bit of "1"), or a "low" value if no electrical charge is to be stored in a corresponding capacitor (that corresponds to writing a data bit of "0"). Thus, during the normal DRAM operation in which data bits are stored by presence or absence of electrical charges in the capacitor. Thus, not all capacitor is charged with electrical charges after the write operation when all, or a portion, of any of the array of memory cells of the present disclosure is employed as a DRAM circuit.

In one embodiment, an array of memory cells of the present disclosure can be designed to be operable in dual modes (i.e., for a "dual mode operation"), i.e., in a mode in which retention time mode is stored as data (which is herein referred to as a "retention time mode") or in a mode in which stored electrical charge represents data (which is herein referred to as a "charge data mode" or a "normal mode"). The mode of operation can be selected by an external command (which can be provided by a processor or a memory controller).

Figure 9:
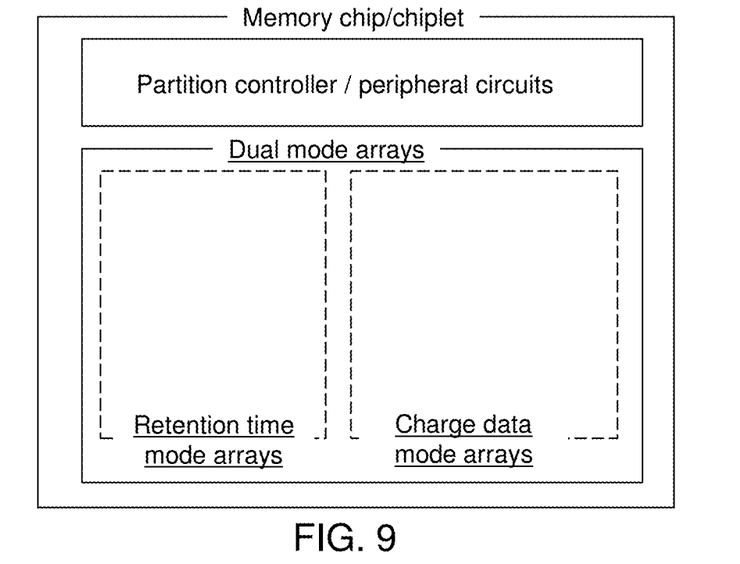
FIG. 9 is an exemplary semiconductor device embodying a semiconductor circuit including a memory cell array configured to be partitioned into a first array configured to store data employing programmable retention times and a second array storing data configured to store data employing presence or absence of stored electrical charges according to an embodiment of the present disclosure.

Further, an array of memory cells can be provided with a partition controller as illustrated in FIG. 9. As an illustrative example, FIG. 9 shows two partitions in a contiguous array. In general, the partition can have multiple variable size partitions, each independently programmed to operated in a retention time mode, or in a charge data mode depending on an input provided to the partition controller. In one embodiment, each partition can be a bit cell or a set of multiple grouped bit cells distributed in an array, each configured to operate either in a retention time mode cell or in a charge data mode. In one embodiment, the partition controller can divide an array of memory cells configured for dual mode operation (which is herein referred to as a "dual mode array") into a first array operating in the retention time mode and a second array operating in the charge data mode. The first array is configured to store data employing programmable retention times, and the second array storing data configured to store data employing presence or absence of stored electrical charges. The size of the first array and the second array can be arbitrarily selected by the partition controller. In other words, the partition controller can set the relative sizes of the first array and the second array as needed or as instructed by a processor or a memory controller. Alternatively, partition of the array can not be performed, and the entire array can operated either in a retention time mode or in a charge data mode. In one embodiment, the entire array may operated in a retention time mode, and subsequently operate in a charge data mode, or vice versa.

The semiconductor circuit included in the semiconductor device of FIG. 9 includes a memory cell array (i.e., an array of memory cells) and a partition controller. The memory cell array is configured to be partitioned into the first array of memory cells in which stored data is in the form of a selected programmed mode having different durations of a charge retention time, and a second array of memory cells in which stored data is in the form of the amount of electrical charge stored in a corresponding memory cell. The amount of electrical charge can be a target electrical charge storage amount in a capacitor for a "1" state, or zero for a "0" state. The partition controller is configured to change sizes of the first and second arrays depending on a parameter that is internally generated or externally supplied.

The memory cells within the first array are configured to be programmed into a selected memory mode selected from a short retention time mode and a long retention time mode in a programming operation. Each memory cell in the first array is configured to store, after a charging operation on the array of memory cells, the same amount of electrical charge irrespective of a corresponding selected memory mode. Each memory cell in the short retention time mode retains electrical charges for a duration shorter than a threshold retention time, and each memory cell in the long retention time mode retains electrical charges for a duration longer than the threshold retention time.

The memory cell array can be configured, upon partitioning into the first array and the second array, to supply different programming voltages to each memory cell within the first array depending on a corresponding selected memory mode, i.e., in the retention time mode operation. Further, the memory cell array can be configured to supply the same gate voltage to each active gate within the second array during storage of data in any memory cell within the second array, i.e., during the normal writing operation in the charge storage mode. Optionally, the first array and $2^{nd}$ array may be configured within a same array by creating a partition using row and column addresses.

The various circuits of the present disclosure can be implemented as semiconductor devices without any additional processing steps to a normal flow of processing steps employed to form DRAM devices. The various circuits of the present disclosure can be formed by adding additional circuitry for applying suitable voltages to the word lines and for applying suitable voltages to the bit lines. In addition, the memory devices of the present disclosure can be programmed multiple times and read multiple times, and as such, operates as a Multiple-Time-Programmable-Read-Only-Memory (MT-PROM) device.

While the disclosure has been described in terms of specific embodiments, it is evident in view of the foregoing description that numerous alternatives, modifications and variations will be apparent to those skilled in the art. Each of the embodiments described herein may be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor circuit comprising:
an array of memory cells configured to be programmed into a selected memory mode selected from a short retention time mode and a long retention time mode in a programming operation, wherein each memory cell in said array is configured to store, after a charging operation on said array of memory cells, a quantity of electrical charges, and each memory cell in said short retention time mode retains electrical charges for a duration shorter than a threshold retention time and each memory cell in said long retention time mode retains electrical charges for a duration longer than said threshold retention time; and
comparators configured to compare output voltages from said array of memory cells with a sensing reference voltage and to generate an output based on a sign of a difference between an output voltage of a selected memory cell and said sensing reference voltage.

2. The semiconductor circuit of claim 1, further comprising a programming circuitry configured to supply different programming voltages to each memory cell depending on a corresponding selected memory mode.

3. The semiconductor circuit of claim 2, wherein said different programming voltages program each programmed memory cell into states having different levels of leakage currents.

4. The semiconductor circuit of claim 1, further comprising a timer configured to trigger measurement of remaining electrical charge in said array of memory cells after passage of a time duration having a length of said threshold retention time from said charging operation.

5. The semiconductor circuit of claim 1, wherein each memory cell within said array includes a series connection of a capacitor and an access field effect transistor.

6. The semiconductor circuit of claim 5, wherein programming of each memory cell selects a leakage current level of a corresponding access field effect transistor through charge trapping in a gate dielectric.

7. The semiconductor circuit of claim 5, wherein drain nodes of access field effect transistors within a same column are electrically shorted to a bit line, and gate nodes of access field effect transistors within a same row are electrically shorted to a word line that is configured to supply a voltage selected from a plurality of gate voltages during programming of said memory cells.

8. The semiconductor circuit of claim 5, wherein a same gate voltage is applied to each gate node in said array and a same drain voltage is applied to each drain node in said array during said charging operation.

9. The semiconductor circuit of claim 1, wherein said array of memory cells includes an array of complementary pairs of memory cells, wherein each complementary pair of memory cells includes a true data memory cell configured to be programmed into said selected memory mode and a complementary data memory cell configured to be programmed to a memory mode different from said selected memory mode.

10. The semiconductor circuit of claim 1, wherein each memory cell in said array is programmable into an arbitrary state selected from said short retention time mode and said long retention time mode.

11. A semiconductor circuit comprising a memory cell array, wherein memory cells in said memory cell array are configured to be operable in a first mode of a retention time mode in which stored data is in a form of a selected programmed mode having different durations of a charge retention time, and to be operable in a second mode of charge data mode in which stored data is in a form of an amount of electrical charge stored in a corresponding memory cell, wherein selection between said first and second modes is made depending on a parameter that is internally generated or externally supplied.

12. The semiconductor circuit of claim 11, further comprising a partition controller that partitions said memory cell array into a first array of memory cells operating in said first mode and a second array of memory cells operating in said second mode, wherein said partition controller is configured to change sizes of said first and second arrays depending on a parameter that is internally generated or externally supplied.

13. The semiconductor circuit of claim 12, wherein memory cells within said first array are configured to be programmed into a selected memory mode selected from a short retention time mode and a long retention time mode in a programming operation, wherein each memory cell in said first array is configured to store, after a charging operation on said array of memory cells, a same amount of electrical charge irrespective of a corresponding selected memory mode, and each memory cell in said short retention time mode retains electrical charges for a duration shorter than a threshold retention time and each memory cell in said long retention time mode retains electrical charges for a duration longer than said threshold retention time.

14. The semiconductor circuit of claim 13, wherein said memory cell array comprises comparators configured to compare output voltages from memory cells within said memory cell array with a sensing reference voltage and to generate an output based on a sign of a difference between an output voltage of a selected memory cell and said sensing reference voltage.

15. The semiconductor circuit of claim 12, wherein said memory cell array is configured, upon partitioning into said first array and said second array, to supply different programming voltages to each memory cell within said first array depending on a corresponding selected memory mode, and to supply a same gate voltage to each active gate within said second array during storage of data in any memory cell within said second array.

16. A method of operating a semiconductor circuit comprising:
  providing an array of memory cells configured to store electrical charges therein;
  programming each memory cell in said array into a selected memory mode selected from a short retention time mode and a long retention time mode in a programming operation, wherein said long retention time mode provides a retention time longer than a threshold retention time and said short retention time mode provides a retention time shorted than said threshold retention time;
  storing a same amount of electrical charge irrespective of a corresponding selected memory mode within each memory cell in said array in a charging operation; and
  detecting a memory mode of each memory cell by measuring a quantity of a remaining electrical charge in each corresponding memory cell by performing a sensing operation said threshold retention time after performing said charging operation.

17. The method of claim 16, further comprising:
  comparing output voltages from each memory cell with a sensing reference voltage; and
  generating an output based on a sign of a difference between an output voltage of a selected memory cell and said sensing reference voltage.

18. The method of claim 16, further comprising supply different programming voltages to each memory cell in said array depending on a corresponding selected memory mode.

19. The method of claim 18, wherein each memory cell within said array includes a series connection of a capacitor and an access field effect transistor, and wherein said different programming voltages are supplied to a gate electrode of a corresponding memory cell depending on said selected memory mode.

20. The method of claim 16, further comprising:
  providing an array of data bits to be stored within said array of memory cells; and
  programming each memory cell in said array to store said array of data bits such that each selected memory mode in said array of memory cells corresponds to a value of a corresponding data bit within said array of data bits.

* * * * *